United States Patent [19]

Vajdic et al.

[11] Patent Number: 4,791,326

[45] Date of Patent: Dec. 13, 1988

[54] CURRENT CONTROLLED SOLID STATE SWITCH

[75] Inventors: Branislav Vajdic, Santa Clara; Stephen L. Smith, Sunnyvale, both of Calif.

[73] Assignee: Intel Corporation, Santa Clara, Calif.

[21] Appl. No.: 5,941

[22] Filed: Jan. 22, 1987

[51] Int. Cl.[4] .................. H03K 17/04; H03K 5/08; H03K 17/687; H03K 17/14
[52] U.S. Cl. .................... 307/571; 307/555; 307/568
[58] Field of Search ............ 307/572, 571, 445, 448, 307/262, 555, 568; 330/257, 288

[56] References Cited

U.S. PATENT DOCUMENTS

| | | | |
|---|---|---|---|
| 4,283,673 | 8/1981 | Lieux | 323/316 |
| 4,399,399 | 8/1983 | Joseph | 323/316 |
| 4,529,891 | 7/1985 | Oida | 330/257 |
| 4,550,262 | 10/1985 | Kohsiek | 323/316 |
| 4,573,177 | 2/1986 | Petrosky | 330/257 |
| 4,605,907 | 8/1986 | Rosenthal et al. | 330/257 |
| 4,625,131 | 11/1986 | Kasperkovitz et al. | 307/494 |

Primary Examiner—John Zazworsky
Attorney, Agent, or Firm—Blakely, Sokoloff, Taylor & Zafman

[57] ABSTRACT

A current controlled switch to compensate for switching time variations. A compensated current source is configured to operate with a current mirror to set the switching current. The control of the switching current maintains control of the peak switching current in the switch, therein controlling the switching transition time. The speed performance is maintained nearly uniform as circuit and process variations cause switching conditions to change. Applications such as delay lines, output buffers, inverters and ringing oscillators are available using the current controlled switching technique of the present invention. Also, parasitic effects can also be compensated by using the present invention.

10 Claims, 3 Drawing Sheets

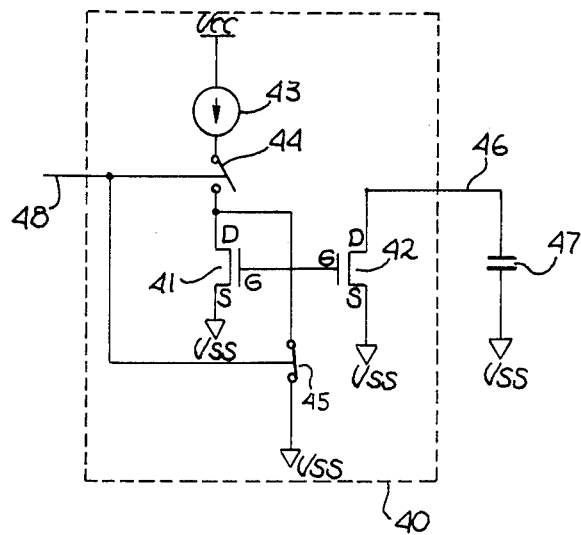
_Fig. 5_
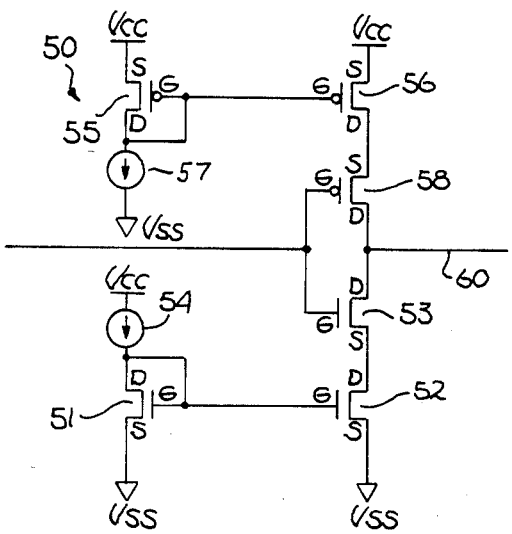
_Fig. 6_
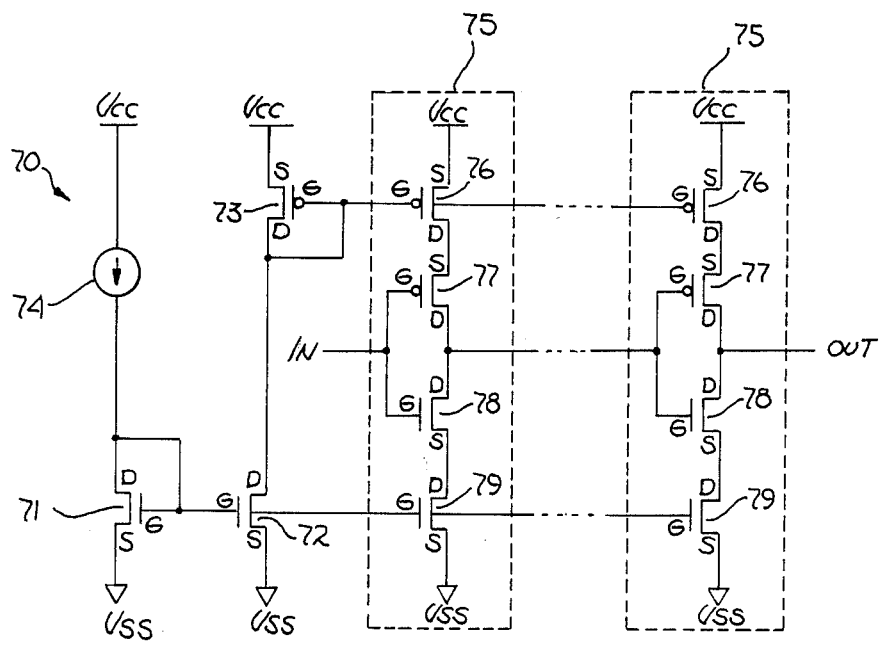
_Fig. 7_

CURRENT CONTROLLED SOLID STATE SWITCH

BACKGROUND OF THE INVENTION

1. Field of the Invention

The present invention relates to a field of solid state switches and more specifically to control of their switching speeds.

2. Related Application

The present application is related to a copending U.S. patent application Ser. No. 005,942 filed Jan. 22, 1987 (U.S. Pat. No. 4,727,309) entitled "Current Difference Current Source" and is incorporated herein by reference to provide a teaching of such current source to be used in the compensated current source of the present invention.

3. Prior Art

In the design of solid state circuits and devices, controlling the switching characteristic of a device is a very desirable feature. It is well-known in the prior art that switching devices, such as transistors, draw higher peak current at faster switching speeds then at slower switching speeds. This difference is attributed to a change in the inherent properties of the device, as well as to a change in the external conditions, such as temperature and power supply voltage.

In a typical prior art transistor, higher peak current is encountered when switching at a faster rate in comparison to peak current encountered at a slower switching rate. Because these transistors are not compensated, they respond differently at faster switching conditions than at slower switching conditions and ideal or uniform responses are difficult to achieve at all switching conditions.

In the design of a certain circuit, such as oscillators, output buffers and delay lines, an appreciable variation in the switching speed introduced by changes in the external conditions and process variations present a difficult constraint to a designer. For example in a CMOS inverter, peak switching current depends on the electrical characteristic of switching transistors and the rise and fall times of input and output signals. Typically, the dominant transistor affecting the value of the peak switching current is the transistor that is charging or discharging the load capacitor during that particular transition.

In another example dealing with an output buffer, it has been the practice to design a device to provide predetermined parameters at the faster switching conditions. That is, maximum peak current and switching speed parameters were determined at the faster switching speed. The speed response occuring at the slower switching condition was typically a resulting response from the faster switching condition design. Further, output buffer devices suffered from ringing at higher speed switching conditions and provided poor low speed switching response.

Typically in the prior art, circuits were designed for a worst case condition and the performance of the circuit to other conditions were subject to variations of supply voltage, temperature, transistor process and saturation current. It is appreciated then that what is needed is a device that is capable of providing substantially uniform responses at all switching conditions, such that a more stable and controllable switching speeds are achieved.

SUMMARY OF THE INVENTION

The present invention provides for an apparatus and a method to compensate for switching time variations in a semiconductor device or circuit. The current limited switch of the present invention provides for a controlled current response and thus switching speed. By lowering peak current and extending a delay period during faster switching conditions, the switch response characteristic is controlled to match the response of a slower switching condition. By having a nearby uniform switching response, the switch is made independent of various circuit and process variations.

The current controlled switch of the present invention uses a current source to provide a relatively steady current independent of circuit and process variations. A current mirror configuration is used with the current source to set the peak switching current.

The present invention is implemented in a variety of circuit applications. Such applications include, but are not limited to, such circuits as an inverter, delay line, output buffer and stable oscillator. In one example, the current controlled switch operate to suppress inductive voltage spikes in a circuit.

BRIEF DESCRIPTION OF THE DRAWINGS

FIG. 5 is a schematic diagram of another switching circuit of the present invention.

FIG. 6 is a circuit schematic of a dual current controlled switch of the present invention.

FIG. 7 is a circuit schematic of an embodiment of the present invention using a plurality of current controlled CMOS inverters.

DETAILED DESCRIPTION OF THE INVENTION

The present invention provides for an apparatus and a method for controlling a current in a solid state switch. In the following description, numerous specific details are set forth such as specific circuits, graphic representations, etc., in order to provide a thorough understanding of the present invention. It will be obvious, however, to one skilled in the art that the present invention may be practiced without these specific details. In other instances, well-known circuits and processes have not been described in detail in order not to unnecessarily obscure the present invention.

Figure 1:
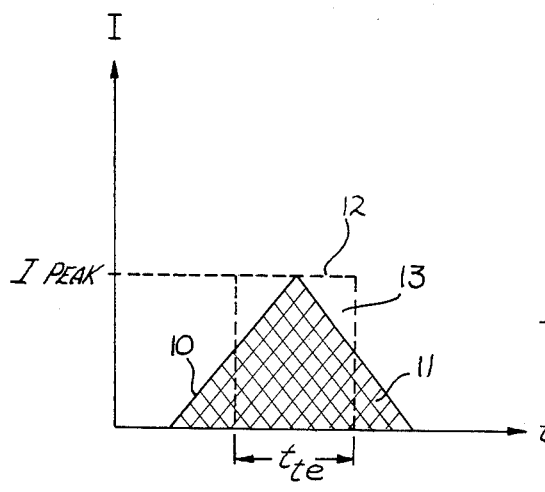
FIG. 1 is a graph showing switching current response during a switching cycle.

Referring to FIG. 1, a graphic representation of current versus time of a switching characteristic of a CMOS inverter is shown. Assuming that a load capacitor ($C_1$) is coupled as an output load to a CMOS transistor comprising the inverter. When the inverter is switching, curve 10 exemplifies a charging curve characteristic of the CMOS transistor. The area 11 under curve 10 represents the total charge that was placed or removed from the load capacitor. Area 11 representing the total charge is alternatively represented by a rectangle 12, wherein area 13 within rectangle 12 is equivalent to area 11 of triangle 10 Therefore, the total charge transfer of the CMOS inverter having a capacitive load is represented by area 11, which is equivalent to area 13 within rectangle 12. The vertical dimension of rectangle 12 is represented by a peak current $I_{peak}$ and the horizontal dimension of rectangle 12 is represented by an equivalent transition time $t_{te}$.

In equation form:

$$Q = C_1 \times Vcc = I_{peak} \times t_{te} \qquad \text{[Equ. 1]}$$

wherein, $$t_{te} = C_1 \times Vcc / I_{peak} \qquad \text{[Equ. 2]}$$

From the equations it is evident that the equivalent transition time, which translates to transistor switching speed, is dependent on variations in the supply voltage (Vcc) and peak current ($I_{peak}$), because in most instances the value for $C_1$ remains fairly constant. Equation 2 permits an easy comparison of switching speeds to various temperature and Vcc values, as well as to process variations.

Figure 2:
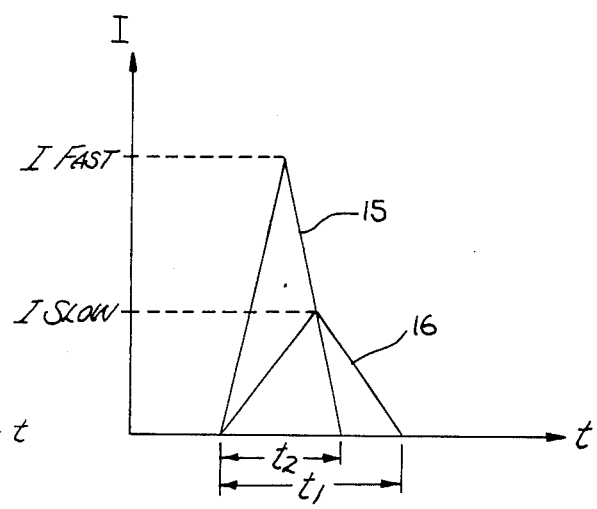
FIG. 2 is a graph showing switching current response during two conditions of a switching cycle.

Referring to FIG. 2, a graphic representation of current versus time for an inverter utilizing a CMOS transistor configuration is shown. Again, assuming a capacitive load at the output of the inverter circuit, the areas under the curves 15 and 16 represent the total charge transferred during a switching sequence. Curve 16 represents a switching current characteristic for slower switching conditions of the inverter, while curve 15 represents switching current characteristic under faster switching conditions. Slower condition response has a total delay time of time $t_1$. Faster condition response of the transistor has a delay time of $t_2$, which is less than delay time $t_1$. As explained in the description of FIG. 1 the areas under curves 15 and 16 are equivalent. Slower switching conditions are experienced typically when high temperature, low Vcc, and low saturation current ($I_{sat}$) are present and faster switching conditions involve factors such as low temperature, high Vcc and high $I_{sat}$. Slowest or fastest conditions occur when all slowest or fastest parameters are present.

In a switching sequence, a finite amount of charge must be moved a finite voltage difference and the amount of charge transfer is mostly independent of the switching conditions encountered. Therefore, in a faster switching condition, to move a certain number of charge within time $t_2$, a particular peak current $I_{fast}$ is needed. In a slower switching condition, because a lower peak current, $I_{slow}$, is available to move the charge, an equal amount of charge will be moved in a longer time. Curve 15 represents a faster switching condition, wherein the peak current $I_{fast}$ is at a value higher than that of $I_{slow}$ of curve 16. The switching transition time $t_2$ of curve 15 is faster than that of time $t_1$ of curve 16.

Given a particular transistor device, the operation of the transistor given above-described parameters determines the possible switching speeds available. Curve 15 is an example of a faster switching condition. When the same transistor switches at a much slower rate, a typical response is that of curve 16. A ratio of peak currents, $I_{fast}$ to $I_{slow}$, can be greater than five for some devices. Ideally, what is desired is a uniform peak level such that the peak current level is maintained at a constantly controlled level, therein preventing drastic variations of peak current values as switching conditions change. Equation 2 suggests that by controlling the value of $Vcc/I_{peak}$, the switching speed will be controlled in the same manner.

From equation 1 and 2, it is evident that by maintaining a fairly steady value of $I_{peak}$, the transition time will remain proportionately constant. This assumes that supply voltage (Vcc) can be made steady from the power supply and can be treated almost as a constant in the equations. In the alternative, when power supply voltage varies, a circuit can compensate for varying Vcc by providing $I_{peak}$ that will track with Vcc changes, keeping ratio $Vcc/I_{peak}$ constant.

Typically, saturation current through a transistor is determined by Vcc, temperature and the inherent characteristic of the transistor. Because in the prior art the design constraint was placed on worst case conditions, the resulting switching performance for other conditions was typically dictated by variations of supply voltage, temperature and process variations. Prior art uncompensated switches were designed for worst case and device performance varied considerably depending on the condition encountered. FIG. 2 also illustrates an example of this prior art design, wherein the worst case constraint is shown in curve 16 in which the longest transition period occurs. Therefore the worst case condition was deemed to be the slowest switching conditions, which has the longest transition period.

However, a circuit designed with the worst case constraint of curve 16 in mind could very well have conditions change such that the performance of the device shifts to that of curve 15. The higher peak current of curve 15 as well as the variations in switching speed could be unfavorable or even disruptive in certain circuits and applications. A purpose of the present invention is to provide a compensating switch which controls the value of the peak current at all switching conditions. By keeping the peak switching current at a fairly constant value, the circuit will have a predictable performance at all switching conditions. By carefully controlling the peak current an independent control of switching times is achieved. For a complete control under all conditions, the maximum forced peak current ($I_{f-pk}$) allowed under the forced compensated condition must be equal to or lower in value than the natural peak current encountered during switching conditions in an unregulated switch. That is, the forced peak current should be the determining factor for peak switching current under all conditions. Also, a reverse compensated circuit can be used such that the maximum peak current level under any condition is lower in value than the maximum peak current encountered during the slowest switching condition. A basic principle behind the present invention is to provide a current controlled switch to control peak current through a switching gate to retain full control over its switching speed.

Figure 3:
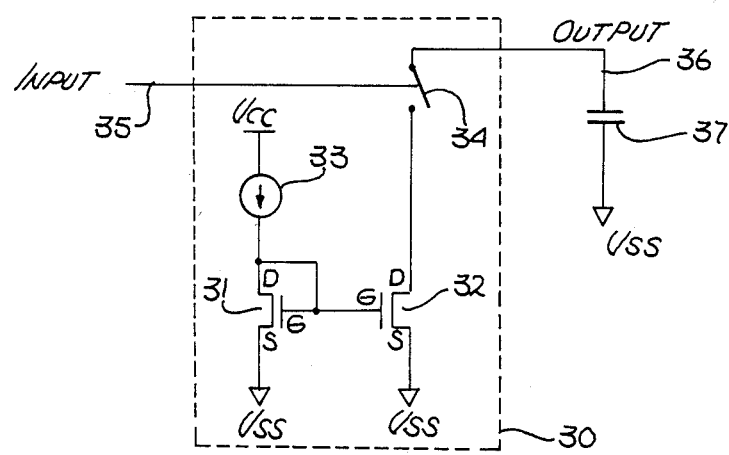
FIG. 3 is a schematic diagram of a switching circuit of the present invention.

Referring to FIG. 3, a circuit 30 exemplifying a rudimentary current controlled switch is shown. A switch circuit 30 is comprised of two CMOS transistors 31 and 32, current source 33 and electronic switch 34. Transistors 31 and 32 are configured to operate as a current mirror by having gates of transistors 31 and 32 coupled together to drain of transistor 31. The current source 33 is coupled in series to drain of transistor 31 and Vcc. Sources of transistors 31 and 32 are coupled to Vss, which in this case is ground. Transistors 31 and 32 operate as a current mirror, wherein the current flowing through mirroring transistor 32 is a weighted replication of the current flowing through driving transistor 31. Current mirroring techniques are well-known in the prior art.

Current source 33 coupled to the drain of transistor 31 provides a forced peak current ($I_{f\text{-}pk}$) having a value of maximum peak current as described in the description above. Drain of transistor 32 is coupled to one terminal of switch 34. The other terminal is coupled to output line 36. An input signal on input line 35 is coupled to activate switch 34, such that when switch 34 closes line 36 will be coupled to drain of transistor 32. Output line 36 of switch 30 is coupled to a load device, which in this example is a capacitor 37 which provides a capacitive load on line 36. Line 36 can be coupled to other circuitry.

Typically, prior art circuits couple line 36 directly to Vss through switch 34. The present invention as shown in circuit 30 places transistor 32 in series with switch 34, such that when switch 34 closes line 36 is coupled to Vss through both switch 34 and transistor 32. Because transistor 32 operates as a current mirror, the current through transistor 32 is a function of the current flowing through transistor 31. However, transistor 31 is coupled in series with current source 33, such that the current flowing through transistor 31 will always be maintained at a fairly constant value. Therefore, transistor 32 will operate to provide a steady current to the circuitry coupled on line 36. As to current source 33, most any current source can be employed to provide a steady current. Advantages of this invention are realized when current from the current source varies less than the transistor current $I_{sat}$. However, a preferred compensated current source is disclosed in the previously cited copending application.

Figure 4:
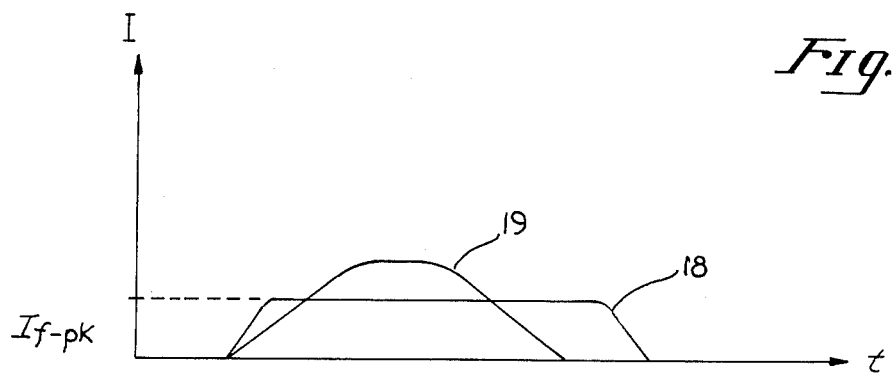
FIG. 4 is a graph showing forced switching current response during switching cycles of the present invention.

Referring to FIG. 4, a current versus time graph using the principle of the present invention is shown. A current source, such as current source 33 of FIG. 3, provides a steady current, wherein maximum peak current is limited to $I_{f\text{-}pk}$ as shown in a response curve 18. If the current source is reverse compensated, then curve 18 will be at the faster switching conditions and curve 19 represents the response at slower switching conditions. In the reverse compensated case, the faster transition times occur at the slower switching conditions.

Referring to FIG. 5, an alternative embodiment of a current switching circuit of the present invention is shown. The switching circuit 40 is comprised of transistors 41, 42, current source 43 and electronic switches 44 and 45. Gates of transistors 41 and 42 are coupled together to the drain of transistor 41 and to one terminal of switch 45. Transistors 41 and 42 operate as a current mirror. The other terminal of switch 45 is coupled to Vss, which in this instance is ground. Drain of transistor 41 is coupled to one terminal of switch 44 and the other terminal of switch 44 is coupled to current source 43. Current source 43 is in series with transistor 41, switch 44 and Vcc. Drain of transistor 42 is coupled to output line 46. A load capacitor 47 is coupled to output line 46. Sources of transistors 41 and 42 are coupled to Vss.

Input line 48 is coupled to activate switches 44 and 45. Switches 44 and 45 operate opposite to each other such that when switch 44 is closed by a signal on line 47, switch 45 is open. When switch 44 is closed switch 45 is open. When the input signal on line 48 closes switch 44, current source 43 controls the maximum current flow through transistor 41. Transistors 41 and 42 operate as a current mirror as earlier described. When switch 44 is open, current source 43 is decoupled from the drain of transistor 41, and switch 45 closes to turn off transistor 42.

In reference to FIGS. 3 and 5, circuits 30 and 40 show switching conditions which pull down a load to Vss. However, it is appreciated that equicalent circuits can be used to pull up a load to Vcc. Further, dual circuits can be used, wherein one circuit controls the pull-up transition and the other circuit controls the pull-down.

Referring to FIG. 6, another alternative embodiment of the present invention is shown. Circuit 50 is a dual current controlled CMOS switch. Circuit 50 is used to control the switching current during both a high-to-low and low-to-high transitions of the switching current. Circuit 50 provides for both transition times to be inversely proportional to the corresponding current source output. Transistors 51-53 and current source 54 comprise one half of the circuit which controls one of the transition periods pulling output line 60 to Vss. Transistors 55-58 and current source 57 comprise the other half of the circuit 50 pulling output line 60 to Vcc. Transistors 51, 52 and current source 54 are coupled to provide a current source and a current mirror as was described in the circuit of FIG. 3. Source of transistor 53 is coupled to drain of transistor 52 and drain of transistor 53 is coupled to output line 60. The input line is coupled to the gate of transistor 53. Transistors 55 and 56 are coupled to operate as a current mirror in the upper portion of circuit 50. However, transistors 55, 56 and 58 are p-channel devices which operate inversely to that of n-channel transistors 51-53. Therefore, gates of transistors 55 and 56 are coupled to the drain of transistor 55 and current source 57 is coupled in series to the drain of transistor 55 and Vss. Source of transistor 55 is coupled to the supply voltage Vcc. Source of transistor 56 is also coupled to Vcc. Drain of transistor 56 is coupled to the source of transistor 58 and drain of transistor 58 is coupled to output line 60. The gate of transistor 58 is coupled to input line 61. Therefore, in circuit 50 output line 60 will latch to Vcc through transistor 58 and 56 or to Vss through transistor 52 and 53. The input signal on line 61 will activate either the upper or the lower portion of circuit 50 by activating transistors 58 or 53, respectively. The output line 60 will latch to Vcc or to Vss depending on the input signal of line 61. Current source 54 and 57 will determine the maximum peak current permitted to flow through transistors 52, 53, 56 and 58.

Referring to FIG. 7, an application of the present invention is shown. FIG. 7 shows a circuit 70 comprised of a plurality of current controlled CMOS inverter stages to form a delay line. Transistors 71 and 72 are coupled as a current mirror and current source 74 is coupled to the drain of transistor 71 as was described in the current mirror/current source description of FIGS. 3. Circuit 70 is comprised of n current controlled inverter stages 75. Each current controlled inverter stage 75 is comprised of transistors 76-79. Transistors 76-79 of each stage 75 are equivalent in structure and operation as transistors 52, 53, 56 and 58 of FIG. 6.

Gates of transistors 79 of each stage are coupled to the gate of transistor 71, wherein transistor 71 operates as a driving transistor of a current mirror in controlling the current through each mirroring transistor 79. Gates of transistors 77 and 78 are coupled to an input line of each stage, while drains of transistors 77 and 78 are coupled to the output line of each stage as was the case in FIG. 6. Drain of transistor 72 is coupled to the drain of transistor 73. Gate of transistor 73 is coupled to its drain to provide a current mirror by coupling the gate of transistor 73 to the gate of each transistor 76 of each stage 75. Therefore, transistor 71 operates as a current mirror in conjunction with transistor 79 of each stage 75 and transistor 73 operates as a current mirror in controlling the current through transistor 76 of each stage 75. As denoted by the circle on the gate, transistors 73, 76 and 77 are p-channel devices.

Further, transistor 72 which is coupled to transistor 71 functions as a current mirror and its controlled current also flows through transistor 73 such that transistor 72 basically operates as a current source for the current mirror transistor 73. Each stage 75 is coupled in parallel to transistor 71 and 73, however, the signal lines are coupled in series such that output of one stage 75 is coupled to the input of next stage 75, wherein the total delay is determined by the number of stages 75 within circuit 70.

Another application of the present invention uses the circuit of FIG. 7 to provide a ring oscillator. Circuit 70 of FIG. 7 is structured to have an odd number of stages 75 and the output of the last stage is coupled as feedback to the input of the first stage. Because only one current source is used to control the current of both halves of each stage 75, silicon surface area, as well as power dissipation, is reduced due to the use of a single current source 74 as shown if FIG. 7. However, it is evident that transistor 72 of FIG. 7 can be replaced by a second current source.

In reference to circuit 70 when used as a ring oscillator, the range of frequencies that the ring oscillator can provide is wide. The upper freqency limit is determined by the frequency that is obtainable from a non-regulated ring oscillator operating under slower conditions. The circuit of FIG. 7 functions as a current to frequency converter and the problem encountered in designing a ring oscillator or a delay line with controllable frequency or delay, respectively, is reduced to that of designing a current source with a desired characteristic.

Figure 8:
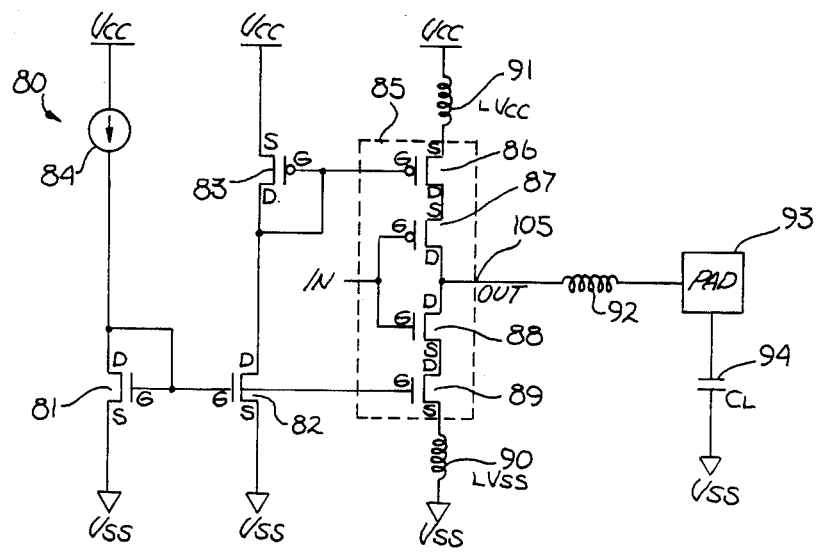
FIG. 8 is a circuit schematic of an inverter of the present invention showing parasitic component effects.

Another application of the present invention is illustrated in a circuit 80 of FIG. 8. Transistors 81, 82, 83 and current source 84 of circuit 80 are configured and operate equivalently to transistors 71, 72, 73 and current source 74 of circuit 70 of FIG. 7. Transistors 86–89, comprising stage 85, are coupled and function equivalently to stage 75 of FIG. 7. Inductance 90 labeled LVss represents lead inductance encountered in coupling stage 85 to Vss. Inductance 91 labeled LVcc represents lead inductance between stage 85 and supply voltage Vcc. Inductance 92 represents lead and bond wire inductance of the output between circuit of stage 85 and the semiconductor chip pad 93. Capacitive load 94 represents capacitance between pad 93 and Vss. Circuit 85 in this instance operates as an inverter.

Elements 90–94 represent the basic parasitic elements associated with an output buffer. The three inductors 90–92 exhibit an oscillatory behavior in causing ringing at the output node represented by pad 93. During the transition periods of the buffer, transistors pass a significant amount of current where peak current may have a value of approximately few hundred milliamperes under faster switching conditions and cause ringing at pad 93. Because $V = L di/dt$, the voltage drop between an inductor's terminals is directly proportional to the rate of change of current through the inductor. The ringing exhibited at the output of the device at pad 93 will affect the transition speed, because ringing at the trailing edge of a transition wave form must subside to a reasonably stable value. The ringing experienced due to inductance 90 can cause malfunction of some internal circuits, especially where those circuits are analog. Without the compensation network, comprised of transistors 81–83 and current source 84 of the present invention, an uncompensated stage 85 will exhibit severe ringing at faster switching conditions when higher peak currents are encountered. Therefore, in the prior art, buffer circuits were designed with the fastest switching condition as the worst case constraint. By limiting the transition period at faster conditions, it resulted in a significant speed penalty at slower switching conditions. However, with the present invention as depicted in circuit 80, the maximum peak current is maintained at a fairly constant value such that the worst case constraint for the slower and faster switching conditions are approximately equivalent.

Referring to FIGS. 3 and 8, various elements of circuit 100 of FIG. 8 are structurally coupled and operate equivalently to the switch 30 of FIG. 3. Transistors 81, 89 and current source 84 are equivalent to transistors 31, 32 and current source 33 of FIG. 3. Transistor 88 is a CMOS representation of electronic switch 34 of FIG. 3.

When an input signal activates transistor 88, pad 93 will be pulled down to Vss. When transistor 88 is inactive (nonconducting) pad 93 will be pulled up to Vcc. By inserting transistor 89 to operate as a current mirror, transistor 89 controls the maximum peak current flowing through transistor 88 and 89 and thereby controls the switching transition time on output line 105. Again the performance of the current source dictates the switching performance of the circuit 80. The upper section, including transistors 83, 86 and 87, operate equivalently during the opposite transition of the input signal and pulling line 105 up to Vcc.

Figure 9:
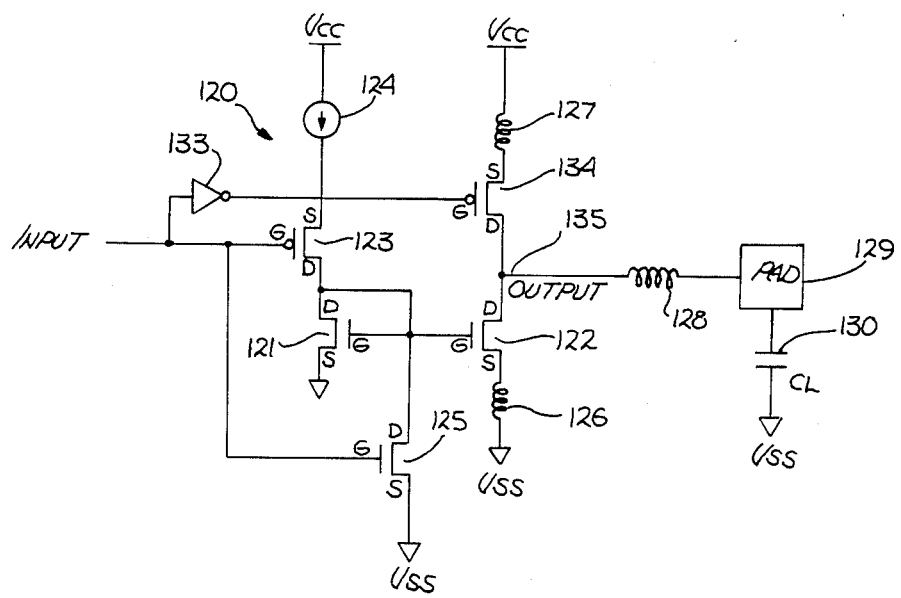
FIG. 9 is a circuit schematic of an output buffer of the present invention implemented using the switching circuit of FIG. 5.

Referring to FIG. 9, another alternative embodiment of the present invention as incorporated in an output buffer is shown. Circuit 120 of FIG. 9 is an equivalent representation of the circuit 40 in FIG. 5. Current source 124 operates equivalently to current source 43. Transistors 121 and 122 operate equivalently to transistors 41 and 42, respectively, and transistors 123 and 125 operate equivalently to electronic switches 44 and 45, respectively. Again inductors 126-128 represent various circuit inductances encountered in the circuit as was the case in FIG. 8. Capacitance 130 and pad 129 are present at the output of the buffer chip and are equivalent to capacitor 94 and pad 93 of FIG. 8.

Whereas circuit 40 did not show the pull up to Vcc, circuit 120 shows a pull up of output line 135 to Vcc. Line 35 is coupled to the drain of transistor 134 and the source of transistor 134 is coupled to Vcc. An input is coupled to gates of transistors 121, 125 and also to gate of transistor 134 through inverter 133. Again, the functional equivalence of circuit 120 is to the switch 40 of FIG. 5, but with the addition of the pull up to Vcc.

Although specific circuits have been described to teach the present invention, it is appreciated that other circuits and other electronic components can be utilized to practice the present invention without departing from the spirit and scope of the present invention. It is to be further noted that current mirrors are used in the various examples, but the present invention is not limited to such use of current mirrors.

Thus a current controlled switch which provides uniform switching speed and stable output is described.

We claim:

1. A current controlled solid state electronic switching circuit for maintaining a substantially uniform switching speed as operating conditions change, comprising:
    a current source for providing a substantially constant first current;
    a first transistor coupled to said current source;
    a second transistor coupled to said first transistor for providing a substantially constant second current and isolated from said current source by said first transistor, but having said second current proportional to said first current;
    switching means coupled to one of said first and second transistors for causing said circuit to be switched on to provide said second current to a load which is coupled to said circuit;
    said second current having its peak current limited to a predetermined value due to said substantially constant first and second currents, wherein limiting maximum value of said peak current attained during switching of said circuit to said predetermined value provides for said substantially uniform switching speed as operating conditions which affect switching speed varies.

2. The circuit of claim 1, wherein said first and second transistors are coupled as a current mirror.

3. The circuit of claim 2, wherein said current source is reverse compensated to reduce said first current as said second transistor attempts to conduct higher peak current when operating condition changes.

4. A current controlled solid state electronic switching circuit, comprising:
    a compensated current source for providing a substantially constant first current;
    a first metal-oxide-semiconductor (MOS) transistor coupled to said current source;
    a second MOS transistor coupled to said first MOS transistor for functioning as a driver for a load coupled to said second transistor;
    said second transistor having its gate coupled to a gate of said first transistor in a current mirror configuration, wherein said second transistor is isolated from said current source but provides a substantially constnt second current which is proportional to said first current;
    switching means coupled to one of said MOS transistors for causing said circuit to be switched to provide said second current to said load;
    said second current having its maximum peak current limited to a predetermined value due to said substantially constant first and second currents, wherein peak current attained during switching of said circuit is limited to said predetermined value, such that operating conditions which would cause faster switching transitions by drawing higher peak current is controlled to a switching speed determined by said predetermined value.

5. The circuit of claim 4, wherein said switching means is coupled to said second MOS transistor for activating said second MOS transistor.

6. The circuit of claim 5, wherein said circuit also functions as an inverter to an input signal coupled to said switching means.

7. The circuit of claim 5, wherein said circuit operates as a compensated output buffer by inhibiting higher peak switching current which interacts with parasitic elements to produce undesirable oscillations.

8. The circuit of claim 4, wherein said current source is reverse compensated to provide a lower first current when said second MOS transistor attempts to provide a higher peak current as operating conditions changes.

9. The circuit of claim 4, further including third and fourth MOS transistors coupled to operate as a current mirror, said third transistor coupled to said second transistor such that peak current in said fourth transistor is also controlled by said current source.

10. The circuit of claim 9, further including a fifth transistor coupled to said first transistor such that said current source controls peak current in said fifth transistor; and
    said fourth and fifth transistors also coupled to a complementary metal-oxide-semiconductor (CMOS) device, wherein high-to-low and low-to-high transition periods of said CMOS device is controled by said fourth and fifth MOS transistors.

* * * * *